United States Patent [19]
Yoneyama

[11] Patent Number: 6,118,695
[45] Date of Patent: Sep. 12, 2000

[54] NONVOLATILE SEMICONDUCTOR MEMORY DEVICE

[75] Inventor: Akira Yoneyama, Oizumi-machi, Japan

[73] Assignee: Sanyo Electric Co., Ltd., Osaka, Japan

[21] Appl. No.: 09/151,080

[22] Filed: Sep. 10, 1998

[30] Foreign Application Priority Data

Sep. 18, 1997 [JP] Japan ................................. 9-253591

[51] Int. Cl.[7] ............................................ G11C 11/34
[52] U.S. Cl. ............................ 365/185.09; 265/189.04
[58] Field of Search ......................... 365/51, 185.09, 365/189.04

[56] References Cited

U.S. PATENT DOCUMENTS

| | | | |
|---|---|---|---|
| 4,691,298 | 9/1987 | Fukuda et al. | 365/189 |
| 5,349,552 | 9/1994 | Zampaglione | 365/51 |
| 5,867,443 | 2/1999 | Linderman | 365/228 |
| 5,880,991 | 3/1999 | Hsu et al. | 365/182 |
| 5,917,752 | 6/1999 | Seki et al. | 365/185.18 |

*Primary Examiner*—David Nelms
*Assistant Examiner*—M. Tran
*Attorney, Agent, or Firm*—Hogan & Hartson LLP

[57] ABSTRACT

A nonvolatile memory increases the number of times that data can be written and the length of time that data can be stored. A feature of the memory sets as a high reliability region a specific memory sector (for example, "0000" to "00FF") among a plurality of memory sectors. Within the high reliability sector, two or more memory cells are simultaneously written with the same data. During reading, the simultaneously written memory cells are read simultaneously, increasing current flow through the parallel current paths.

5 Claims, 6 Drawing Sheets

FIG. 1 -- Prior Art

| MODE | WRITE | ERASE | READ | STANDBY |
|---|---|---|---|---|
| Word Line WLm (Control Gate CG) | 2 V | 14~15 V | 4 V | 0 V |
| Bit Line BLm (Drain D) | 0 V | 0 V | 2 V | 0 V |
| Common Source Line SL (Source S) | 12 V | 0 V | 0 V | 0 V |
| Substrate 102 | 0 V | 0 V | 0 V | 0 V |

FIG. 4

NONVOLATILE SEMICONDUCTOR MEMORY DEVICE

BACKGROUND OF THE INVENTION

1. Field of the Invention

The present invention relates generally to nonvolatile semiconductor memory devices and, more particularly, to nonvolatile semiconductor memory devices capable of increasing the number of times memory cells can reliably be rewritten and limiting cell current reduction in an extended storage time period memory device.

2. Description of the Related Art

In recent years nonvolatile semiconductor memory devices have become more important. Nonvolatile memories include ferro-electric random access memories (FRAM), erasable programmable read-only memories (EPROM), electrically erasable programmable read-only memories (EEPROM), and similar devices. EPROMs and EEPROMs store data by accumulating electrical charge carriers on the floating gate of a memory transistor. A control gate within the memory transistor is used to detect a variation in the threshold voltage of the memory due to the presence or absence of programming charge on the gate of the memory transistor. EEPROMs include "Flash" EEPROMs which provide an array of memory cells divided into sub-arrays or "blocks" where data erasure is performed in units of complete blocks.

Flash-EEPROMs include memory cells which may be generally categorized into two types: the split gate type and the stacked gate type. A conventional Flash-EEPROM cell of the split gate type is illustrated in PCT Publication No. WO92/18980. FIG. 1 illustrates, in cross-section, a single memory cell 101 of the split gate type as shown in the Publication. Referring now to FIG. 1, the illustrated p-type single-crystal silicon substrate 102 has n-type source S and drain D regions formed on its surface. The source S and drain D define therebetween a channel region CH, above which a floating gate FG is formed. The floating gate FG is separated from the channel region CH by a first dielectric film 103. A control gate CG is formed extending partially over the floating gate FG with a second dielectric film 104 separating the control gate CG from the floating gate FG. A portion of the control gate CG is disposed over the channel CH and is separated from the channel CH by the first dielectric film 103 so that control gate CG can be used as a select gate 105 for the memory transistor. Data storage is accomplished by accumulating electrons in the floating gate FG using in part a voltage applied to the control gate CG and interacting with the floating gate FG through the second dielectric film 104.

In those memory devices of the type shown in FIG. 1, which may store electrons in the floating gate FG, the cell current that flows through the memory cell decreases as the memory device is subjected to repeated data rewriting cycles. This reduced cell current may result in the memory cell being unable to reliably perform the data write and read operations required by normal operation of the memory cell. Presumably, the reduced cell current is caused by repeated rewrite operations physically damaging or degrading the quality of the second dielectric film 104. In turn, a damaged dielectric film 104 may make it difficult for electrons to "escape" from the floating gate FG and may trap once-escaped electrons within the second dielectric film 104. The trapped electrons may then return to the floating gate FG, whereby the potential applied to the floating gate FG is effectively reduced so that the channel is not well formed beneath the floating gate FG.

Another disadvantage observed when using conventional floating gate memories is that the time period over which data can be reliably stored is limited. In other words, with conventional floating gate memories there is a risk of data alteration after the elapse of a certain time period resulting in lack of reliability. Data can be altered as electrons leak through the dielectric film to a floating gate FG that is in the erase state, which results in this gate unintentionally changing to an electron injected state.

SUMMARY OF THE PREFERRED EMBODIMENTS

Preferred embodiments of the present invention avoid the above-identified problems encountered in the use of conventional floating gate memories. A particularly preferred embodiment of the invention sets as a high reliability region a specific memory cell selected from among a plurality of memory cells. When writing is performed in this high reliability region, two or more memory cells are subjected to writing simultaneously so that the same data signals are stored in each of the two or more memory cells. During reading operations within the high reliability region, the simultaneously written memory cells are all read at the same time.

According to a preferred aspect of the present invention, a nonvolatile semiconductor memory device includes first and second memory cells. The first memory cells are characterized by a first data storage time characteristic and a first data rewrite number characteristic. The second memory cells are set as a high reliability region so that data stored in the second memory are characterized by a second data storage time characteristic greater than the first data storage time characteristic and a second data rewrite number characteristic greater than the first data rewrite characteristic.

Another preferred aspect of the present invention provides a nonvolatile semiconductor memory device comprising a plurality of first memory cells and a plurality of second memory cells, where the second memory cells are provided within a high reliability region. Writing operations to the high reliability region are performed so that at least two of the second memory cells are written simultaneously and reading operations from the high reliability region are performed so that at least two of the second memory cells are read simultaneously.

The invention may also provide a nonvolatile semiconductor memory device comprising a plurality of source lines, a plurality of bit lines, a plurality of word lines, and a page of memory cells. The page of memory cells includes at least two memory cells using in common a source line and a bit line, with each of the two memory cells having a corresponding one of two word lines. The two word lines are simultaneously selectable so that the two memory cells can be written simultaneously and so that the two memory cells can be read simultaneously.

BRIEF DESCRIPTION OF THE DRAWINGS

FIG. 4 shows selected characteristics of some operational modes of memory cells of a nonvolatile semiconductor memory device embodying aspects of the invention.

DETAILED DESCRIPTION OF THE PREFERRED EMBODIMENTS

An explanation of the present invention will be given in terms of various embodiments of a nonvolatile semiconductor memory device implementing one or more aspects of the invention. According to particularly preferred embodiments of the invention, a nonvolatile memory device has one or more sectors reserved as a "special" sector (high reliability region). This high reliability sector is adapted so that when performing writing operations, data are written or "programmed" into two or more memory cells simultaneously; during reading, data are read out of all of the simultaneously written memory cells at the same time. Operation according to this aspect ensures that cell current is substantially doubled in magnitude thus enabling both an increase in the number of times that data can be rewritten and an increase in storage time as compared to that observed for conventional implementations of floating gate memories.

Figure 1:
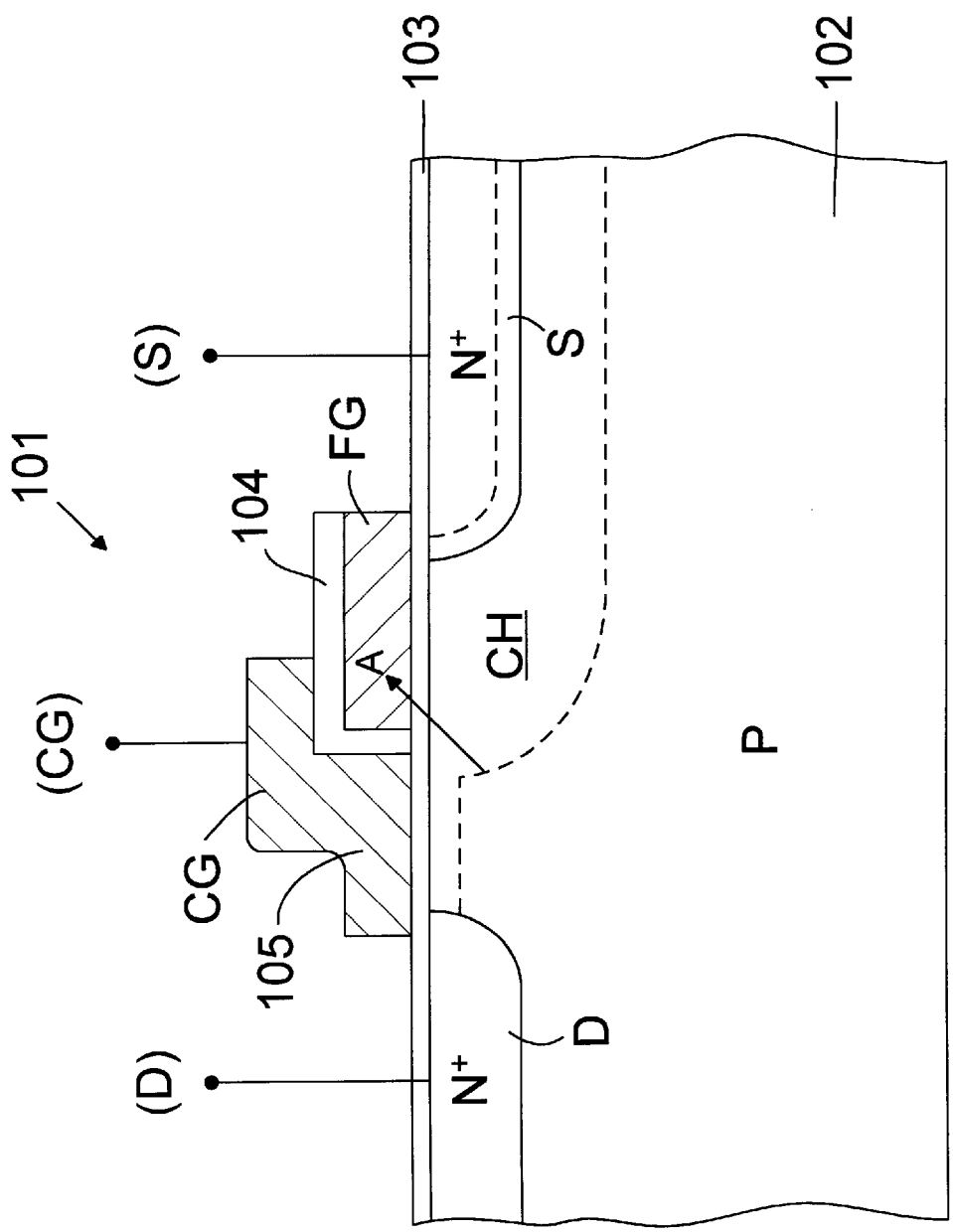
FIG. 1 provides a sectional view of one memory cell of a nonvolatile semiconductor memory device.
Figure 2:
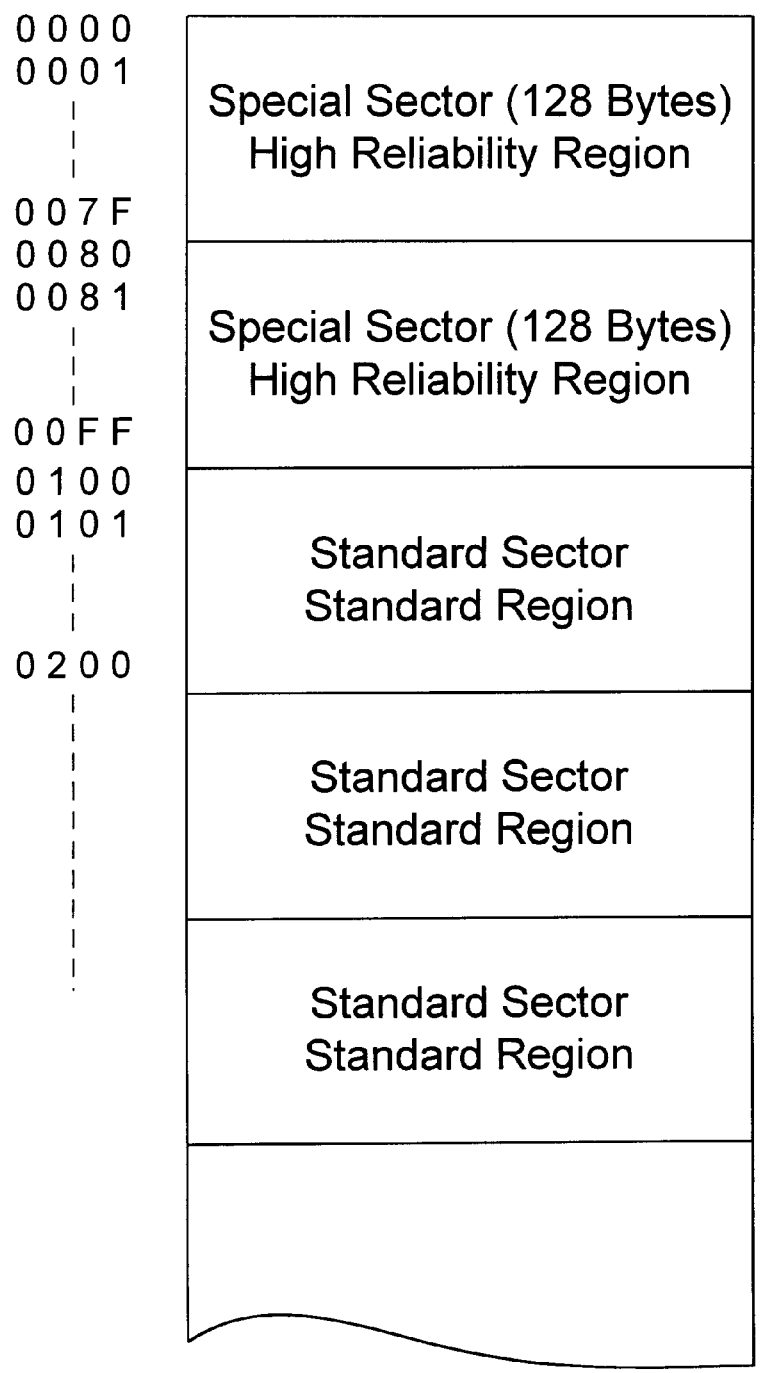
FIG. 2 shows an address map of a memory having two special sectors.

FIG. 2 shows the configuration of a part of a nonvolatile semiconductor memory device embodying preferred aspects of the invention. More specifically, FIG. 2 shows an array of memory cells that is organized into both standard and special or high reliability sectors. Each of the sectors might store, for example, 128 bytes of data and has an address represented by a hexadecimal number. In the arrangement of FIG. 2, two sectors corresponding to addresses "0000" to "00FF" are reserved as special sectors. Those addresses following the address "0100" are used as ordinary sectors or standard regions in which one bit of data is stored into a single corresponding memory cell. Other embodiments of the invention might provide different numbers of special sectors or might provide different memory partitioning schemes.

Figure 3:
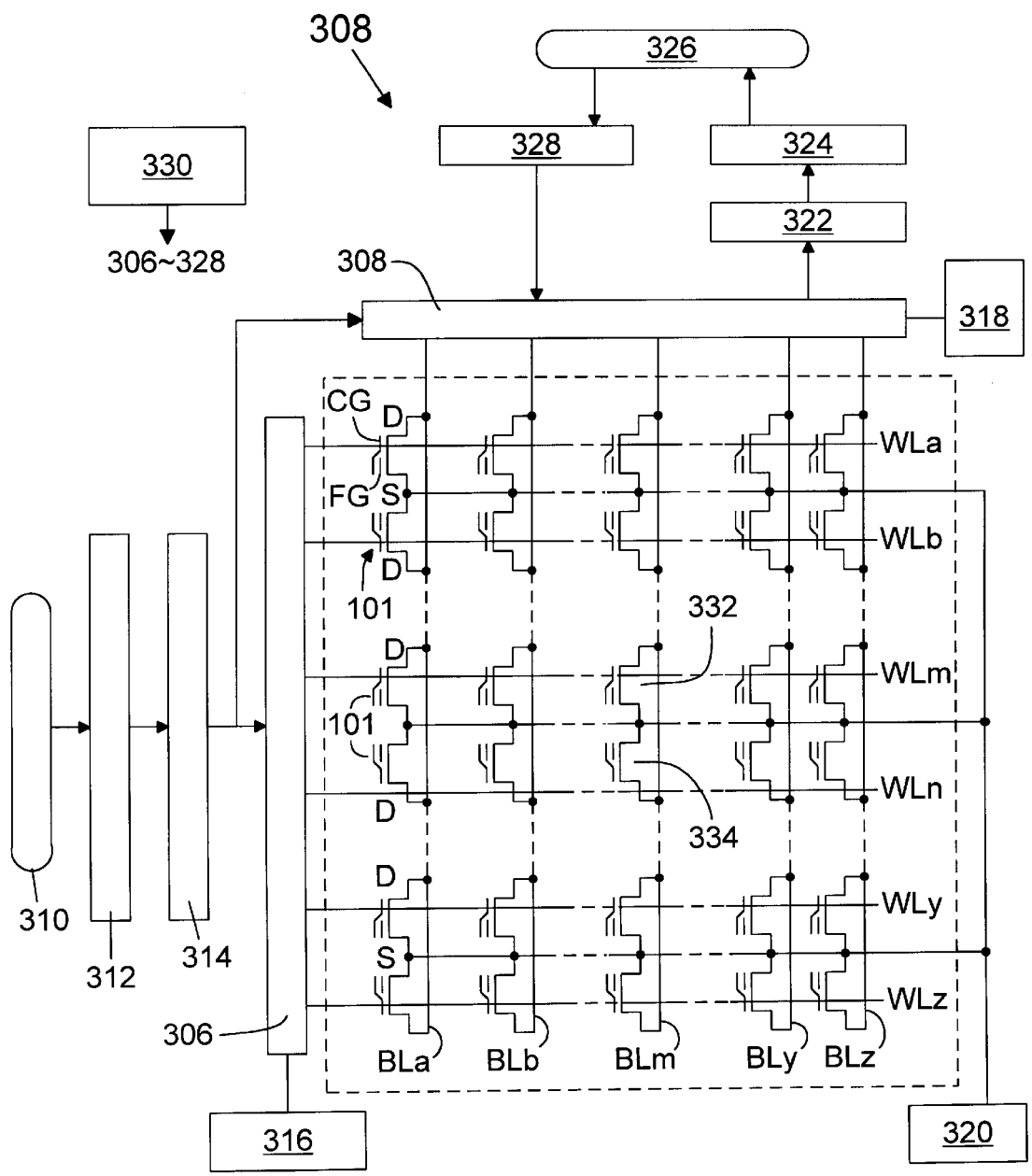
FIG. 3 is a block diagram showing an overall configuration of a nonvolatile semiconductor memory device embodying aspects of the invention.

Turning to FIG. 3, an overall configuration of a Flash EEPROM 300 embodying aspects of the invention is shown which employs memory cells of the split gate type. A memory cell array 302 includes a matrix of rows and columns of memory cells 101. The rows of memory cells 101 are electrically connected at their control gates CG to parallel common word lines WLa to WLz. The columns are coupled at drains D to parallel common bit lines BLa–BLz. All the memory cells 101 have sources S connected together to common source lines SL. Respective word lines WLa–WLz are connected to a row decoder 306 whereas bit lines BLa–BLz are connected to a column decoder 308. Externally supplied row address and column address bits are input to the nonvolatile memory at address pins 310, and then the address bits are transferred from pins 310 through an address buffer 312 to an address latch circuit 314. Of those address bits latched at latch 314, row address bits are sent to the row decoder 306, while column address bits are passed to the column decoder 308.

The memory cell array 302 is divided into a special sector array (for example, those cells associated with word lines WLa–WLn) and a standard sector array (e.g. word lines WLy–WLz). Upon receipt of an address designating a special sector, the row decoder 302 selects two of word lines WLa–WLn (e.g. WLm and WLn) that correspond to the row address as latched in latch 314, then connects the selected word lines WLm, WLn to a gate-voltage control circuit 316.

The column decoder 308 is responsive to receipt of a column address as latched in address latch 314 and selects a corresponding one of the bit lines BLa–BLz (e.g. BLm), which bit line is then coupled to a drain-voltage control circuit 318. The gate voltage control circuit 316 is operable to control voltage potentials of the word lines WLm, WLn as connected via the row decoder 306 in a way that corresponds to a respective one of the operation modes shown in FIG. 4. The output potential of the drain voltage control circuit 318 controls the bit line BLm coupled via the column decoder 308 in a way corresponding to the operation modes illustrated in FIG. 5. The common source line SL is connected to a source voltage control circuit 320. This circuit controls the potential applied to the common source line SL in a way corresponding to the operation modes shown in FIG. 5 to effect data writing operations.

In data reading operations, data are read out of any given one of the memory cells 101 and transferred from a corresponding one of the bit lines BLa–BLz through the column decoder 308 to a sense amplifier group 322. The sense amplifier group 322 includes a predefined number of sense amplifiers (not shown). The column decoder 308 provides an electrical connection between the presently selected bit line BLm and a corresponding sense amplifier. As will be described later, data judged (i.e., detected) by the sense amplifier group 322 is sent from an output buffer 324 via data pins 326 to external circuitry.

In this illustrated embodiment of the invention, two word lines (e.g. WLm and WLn) are simultaneously selected from among those sets of word lines WLa–WLz that select memory cells having sources coupled in common to each other. This selection permits the same data to be written into such two memory cells simultaneously in a relatively simple manner. Accordingly, reading the data from these two memory cells results in a readout cell current being doubled in magnitude. The read, write and other operations of the circuits illustrated in FIG. 3 (306 to 328) are under control of a core control circuit 330.

Consider now a memory cell 332 and memory cell 334 selected as the special-sector memory cells into which the same data signal is to be written in the embodiment illustrated in FIG. 3. The memory cells 332, 334 are related in the manner of memory cells within pages (sectors) having a common source and bit line. A scheme for selecting the word lines WLm, WLn associated with memory cells 332, 334 is to employ a row decoder 306 such as that shown in FIG. 5.

Figure 5:
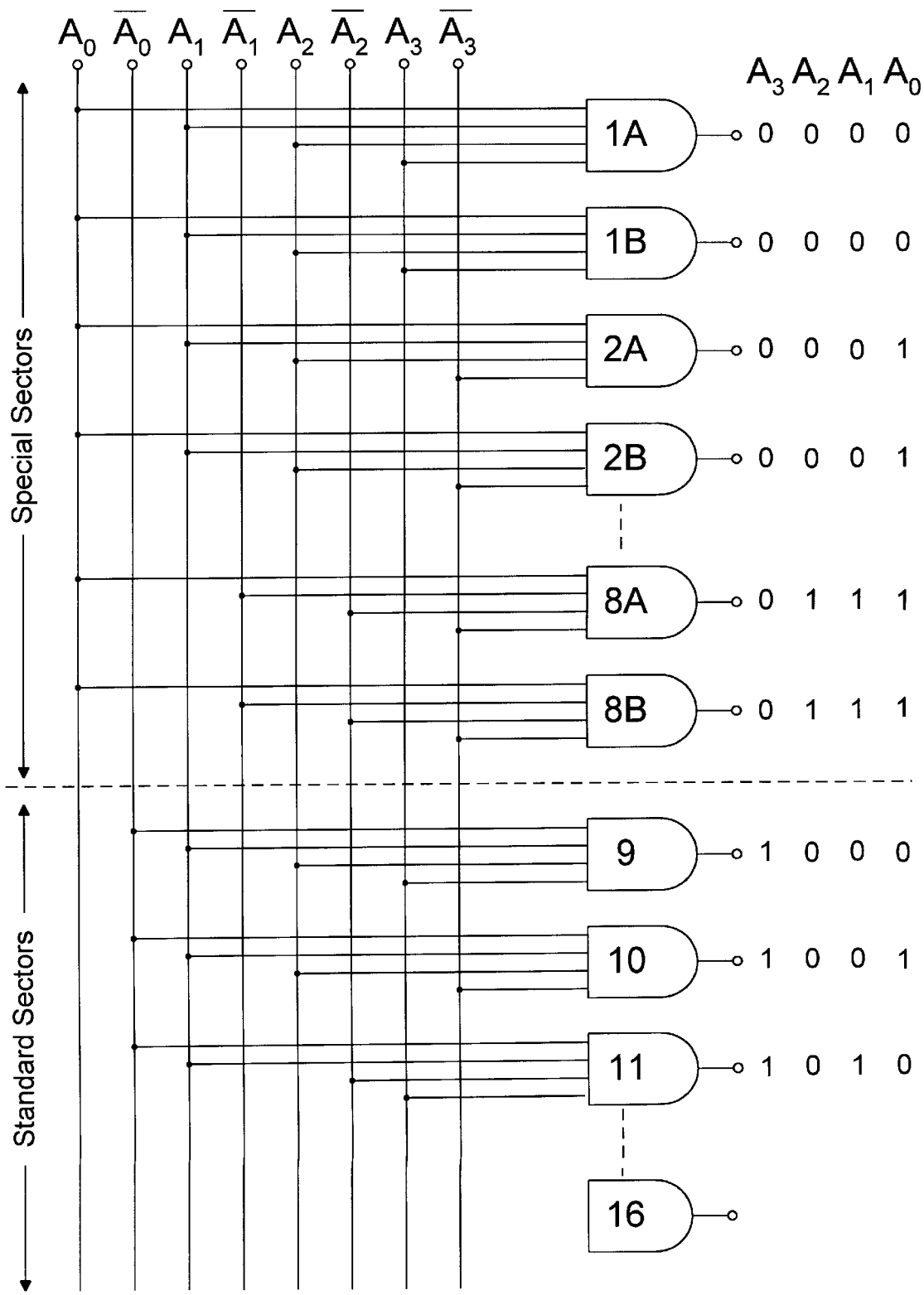
FIG. 5 shows a row decoder 306 that might be used in a nonvolatile memory in accordance with a preferred embodiment of the present invention.

FIG. 5 shows a row decoder 306 in accordance with the present teachings that allows pairs of memory cells to be selected through a hardware configuration modified from the conventional row address decoder configuration. As shown in the exemplary embodiment of FIG. 5, four bit address data are provided through I/O pins and processed to provide signals to address nodes. The address nodes illustrated in FIG. 5 receive eight input address signals A0, *A0, ..., A3, *A3, where the mark "*" is used here to signify the binary complement of a signal and each of the address signals has either the "H" or the "L" level. The circuitry of FIG. 5 provides a number of sets of identical logic gates having identical connections. That is, AND gates 1A and 1B are identical to each other in logical operation, due to the identical input signals provided to the gates. Similarly, AND gates 2A, 2B provide the same logical operations. With such a circuit arrangement, when an address pattern "0000" is input to the FIG. 5 circuitry, for example, the outputs of AND 1A, 1B are both at level "H" whereas the remaining AND gate outputs are at "L" so that two word lines are selected.

This hardware configuration makes it possible by using a single address to select both the word line WLm and word line WLn at the same time. Similar operations are performed for others of the groups, in this embodiment pairs, of "upper" AND gates 1A–8B shown in FIG. 5. According to this implementation of aspects of the invention, addresses within the range of "0000" to "0111" correspond to special sectors and data stored in these sectors are high reliability data because the data signals are stored in two or more memory cells simultaneously. Addresses following the address "1000" correspond to standard sectors that are used in storing normal data. When addresses following "1000" are provided to the circuitry of FIG. 5, only one AND gate has its output go high for each distinct address. In this way, use of the row decoder configuration of FIG. 5 may permit users to selectively use any one of the special sectors for storing important data. Data can be stored in a highly reliable manner by selecting the special sectors for the storage of the data.

An explanation is now given of respective operation modes (erase, write, and read modes) of the Flash EEPROM 300 in conjunction with FIGS. 1 through 5.

(a) Erase Mode

When the EEPROM is set in the erase mode, the potentials of all the bit lines BLa–BLz and common source line SL are held at ground level (=0 V). A selected word line WLm is supplied with a voltage of 14 to 15 volts, whereas the remaining (non-selected) word lines WLa–ALl, WLn–WLz are kept at ground potential. With the application of these voltages, the potential on the control gate of a respective one of those memory cells 101 connected to the selected word line WLm is raised to 14 to 15 V. The electrostatic capacitance between the floating gate FG and portions of the memory cell including the source S and substrate 102 is almost always greater than the gate-to-gate electrostatic capacitance between the control gate CG and floating gate FG. Due to this, a high electric field is created between the control gate CG and floating gate FG when the control gate CG is at 14–15 V and the source is at 0 V. This results in a Fowler-Nordheim (FN) tunnel current flowing as electrons on the floating gate FG move toward control gate CG, erasing the data signal stored in memory cell 101.

The erase operation is done at the same time for all of the memory cells 101 coupled to the selected word line WLm. As necessary, the erase operation may be carried out for all of the memory cells 101 associated with multiple ones of the word lines WLa–WLz by simultaneous selection of these word lines. This erase scheme is called the "block" erase, reflecting the fact that the memory cell array 302 is divided into several blocks each coupled to and addressed by plural ones of the word lines WLa–WLz, permitting data erasure to be done in units of blocks.

(b) Write Mode

In the data write mode the bit lines BLa–BLz are controlled so that bit lines associated with certain memory cells of interest—i.e., the memory cells to be programmed by injecting of electrons into their floating gates FG—are kept at ground potential whereas a high voltage is supplied to the remaining bit lines coupled to the other cells. Note that in preferred embodiments of the instant invention, individual data signals (such as bits) of important data are "duplicatively" stored in both the memory cell 332 and cell 334 at the same time. Such a duplicative storage strategy offers more stable data storage as well as allowing an increase in the rewrite number for the memory. To effect duplicative storage, the illustrative embodiment applies a voltage of 2 volts to the word lines WLm and WLn and sets the remaining non-selected word lines WLa-ALl, ALo-WLz at ground potential. The common source line SL is given a 12-V voltage. Writing may then be done with respect to the memory cells 332, 334 simultaneously.

Each memory cell 101 includes a transistor having its source S and drain D, and control gate CG, where the transistor has a threshold voltage Vth that is typically about 0.5 volts. Within individual ones of selected memory cells 101, electrons residing within the drain D move or "migrate" into the channel CH, which is in the inverted state. This inverted channel results in a current (cell current) flowing from source S to drain D. On the other hand, upon application of a 12 V voltage to source S, the potential underlying floating gate FG is raised due to the capacitive coupling between source S and floating gate FG. This creates a high electric field between control gate CG and floating gate FG. Thus, electrons within channel CH are electrically accelerated producing the so-called "hot" electrons, which are then injected into the floating gate FG as shown by arrow A in FIG. 1. As a result, a desired amount of charge is accumulated on floating gate FG of each selected memory cell 101 so that 1-bit data are written and stored in the cells.

(c) Read Mode

When the Flash EEPROM is in the read mode, a voltage of 4 volts is applied to the word lines WLm, WLn and from the word lines to the control gates CG of the selected memory cells 101, while any remaining, non-selected word lines WLa–WLl, WLo–WLz are set at ground potential. A voltage of 2 V is applied to the one bit line BLm connected to the drains D of selected memory cells 332, 334, whereas the other non-selected bit lines BLa–BLl, BLn–BLz are coupled to ground.

As discussed previously, the floating gate FG of each of the erased ones of the memory cells 101 is charged to a positive polarity as the result of removing electrons from the floating gate FG. The floating gate FG of each one of the programmed memory cells 101 is, on the other hand, charged to a negative polarity by injecting electrons into the floating gate. Accordingly, in the individual erased memory cell 101, the channel CH immediately underlying the floating gate FG is rendered conductive (turned on) while the channel CH of each programmed cell is rendered nonconductive (turned off). Consequently, application of a read voltage of 4 volts to the control gate CG causes a cell current to flow from drain D to source S in the erased cell that is greater in magnitude than the current that flows in a programmed memory cell upon application of a similar read voltage.

Referring once again to FIG. 3, then, memory cells 332, 334 are programmed so that the floating gate has a negative polarity. This programmed state is identified in the read operation by a relatively low level of current flow. More specifically, when the read voltage is applied to the gates of memory cells 332, 334, a cell current flows in the memory cells 332, 334 that is sufficiently small so that the cells are recognized as being programmed by the normal read circuits of the memory. On the other hand, assuming that these cells 332, 334 are not subject to programming (i.e., the cells are kept in the erased state) and their floating gates FG are charged to the positive polarity, an increased amount of current flows through the memory cells. This "erased" read current may be two times greater than the read current detected for a standard cell.

The resulting read data is forwarded to a corresponding sense amplifier of the sense amplifier group 322, which attempts to identify the logic value of the data, "1" or "0", by determining whether the value of a cell current Id detected from a cell 101 is greater or less than a reference value. The judgment output from the comparison to the reference current effects the reading of cell data from each of the memory cells 101. Those skilled in the art will appreciate that the data readout is typically done using the definition that data from erased memory cells has the logical value of "1" whereas data from programmed cells is "0". In the illustrated embodiment of the invention, the individual memory cells 101 are capable of storing therein binary data of either the logic value "1" as designated by the erase state or "0" as designated by the programmed state.

Figure 6:
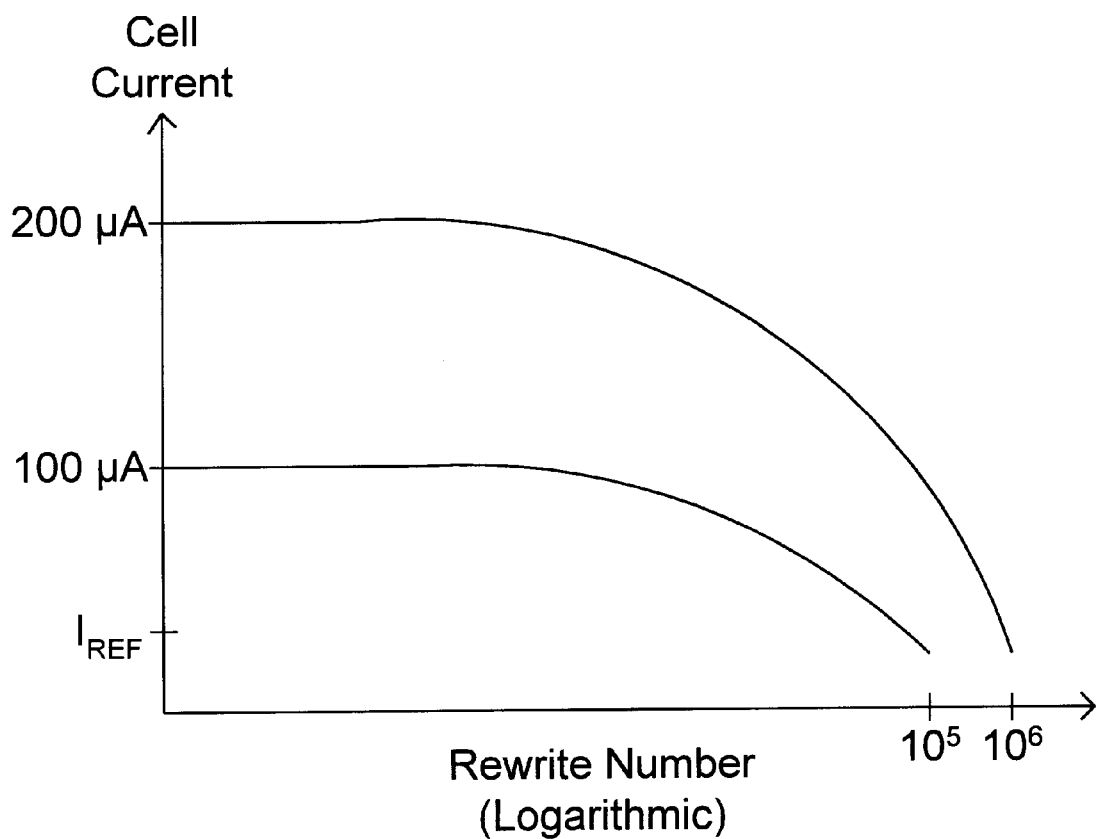
FIG. 6 is a graph showing a relation of a rewrite number versus cell current of the nonvolatile semiconductor memory device.

FIG. 6 shows a relation of a rewrite number versus a cell current. The rewrite number represents how many times the date rewrite or re-programming is carried out and is plotted logarithmically along the horizontal axis of the graph of FIG. 6. A curve "A" indicates a cell current resulting from standard "one-at-a-time" read operations wherein a single memory cell is selected for read at a time. Curve "B" demonstrates a cell current resulting from a "two-at-atime" read procedure in accordance with certain preferred embodiments of the invention, wherein two memory cells are read simultaneously. "Iref" in FIG. 6 represents the value of a reference current used in determining whether a stored data bit is a logic "0" or "1". Comparing the cell-current curves A and B with the reference value Iref, FIG. 6 shows that a Flash EEPROM according to an embodiment of the invention, identified by curve B in FIG. 6, can be rewritten approximately ten times more than the standard EEPROM identified by curve A. The curves of FIG. 6 demonstrate that the floating gate memory cell rewrite number may be significantly increased through practice of preferred embodiments of the invention.

It should be noted that the invention is also capable of increasing the amount of time that data are stored through the accumulation and long-term storage of electrons on the floating gate of each memory cell. The write operation places the floating gate of the written memory cell in the "deep" positive polarity state due to removal of electrons therefrom. If the floating gate is in such a highly positive state, the gate may accommodate an increased number of electrons leaking from nearby structures onto the gate without threatening the integrity of the data stored in the memory cell. The gradual reduction in programming charge can continue for a longer period of time without affecting operation of the memory cell due to the positive state achieved in accordance with preferred embodiments of the invention. The potential drop associated with charge leaking onto the floating gate could otherwise make forming the underlying channel region more difficult, which reduces the current that flows in the memory cell. Advantageously, by practice of preferred embodiments of the invention, the cell current reduction is suppressed by one half, thus increasing the time period over which data can be reliably stored.

According to the present invention, a nonvolatile semiconductor memory device is obtainable which does not exhibit as significant of reduction in cell current even after many rewrite cycles. According to this invention, since two or more memory cells may be designed so that the same data are written into and read from the same two or more memory cells, it becomes possible to increase the rewrite number while enabling important data to be stored therein for an extended time period.

While the present invention has been described with particular emphasis on certain preferred embodiments thereof, the invention is not limited to these particular embodiments. Those of ordinary skill will appreciate that different implementations of this invention and alternate variations can be made, consistent with the teachings herein. Accordingly, the scope of the invention is to be determined by the claims that follow.

What is claimed:

1. A nonvolatile semiconductor memory device, comprising:

a first memory section having a plurality of first memory cells, the first memory section characterized by a first data storage time characteristic and a first data rewrite number, characteristic; and at least one second memory section having a plurality of second memory cells, the second memory section characterized by a second data storage time characteristic greater than the first data storage time characteristic and a second data rewrite number characteristic greater than the first data rewrite characteristic;

wherein information is written to or read from the second memory section by addressing at least two memory cells for each read or write operation.

2. The device of claim 1, wherein the second memory cells are within a contiguous address space.

3. A nonvolatile semiconductor memory device, comprising:

a plurality of first memory cells; and a plurality of second memory cells, wherein writing operations to the plurality of second memory cells are performed so that at least two of the plurality of second memory cells are written simultaneously, reading operations from the plurality of second memory cells are performed so that at least two of the plurality of second memory cells are read simultaneously, and the plurality of first memory cells are addressed individually during reading and writing operations.

4. The device of claim 3, wherein data stored in the plurality of second memory cells is read by addressing at least two second memory cells simultaneously.

5. A nonvolatile semiconductor memory device, comprising:

a plurality of source lines, a plurality of bit lines, and a plurality of word lines; and a page of memory cells including at least two memory cells using in common a source line and a bit line, said two memory cells corresponding to at least two word lines, the two word lines being simultaneously selectable so that data can be written to the two memory cells simultaneously and so that data can be read from the two memory cells simultaneously.

* * * * *